United States Patent [19]

Lepselter et al.

[11] 4,259,680

[45] Mar. 31, 1981

[54] HIGH SPEED LATERAL BIPOLAR TRANSISTOR

[75] Inventors: Martin P. Lepselter, Summit; Simon M. Sze, Murray Hill, both of N.J.

[73] Assignee: Bell Telephone Laboratories, Incorporated, Murray Hill, N.J.

[21] Appl. No.: 141,119

[22] Filed: Apr. 17, 1980

[51] Int. Cl.³ .............. H01L 29/04; H01L 29/72
[52] U.S. Cl. ........................... 357/35; 357/59; 357/67; 357/89
[58] Field of Search ............. 357/59, 67, 35, 34, 357/89, 90

[56] References Cited

U.S. PATENT DOCUMENTS

| 3,427,513 | 2/1969 | Hilbiber | 357/35 |
|---|---|---|---|
| 4,016,587 | 4/1977 | DeLaMoneda | 357/59 |
| 4,076,556 | 2/1978 | Agraz-Geurena et al. | 357/35 |
| 4,160,991 | 7/1979 | Anantha et al. | 357/59 |
| 4,188,707 | 2/1980 | Asano et al. | 357/59 |
| 4,205,333 | 5/1980 | Yamamoto | 357/35 |

OTHER PUBLICATIONS

Gray et al, Analysis & Design of Analog Integrated Circuits, pp. 91–95, Wiley, N.Y., 1977.

Primary Examiner—William D. Larkins
Attorney, Agent, or Firm—David I. Caplan

[57] ABSTRACT

A bipolar transistor NPN structure (20) is constructed at a major surface of a silicon body with a P-type polycrystalline silicon electrode (13) contacting a P-type base zone (13.6). Excess acceptor impurities from the polycrystalline silicon electrode (13) are diffused into the base zone (13.6) in order to tailor its conductivity profile.

9 Claims, 4 Drawing Figures

HIGH SPEED LATERAL BIPOLAR TRANSISTOR

FIELD OF THE INVENTION

This invention relates to the field of semiconductor apparatus, and more particularly to bipolar transistor devices.

BACKGROUND OF THE INVENTION

In the prior art, bipolar transistors have generally been fabricated by processes involving double diffusion of impurities; that is, the base and emitter zones of the transistor are successively formed by diffusion of electrically significant conductivity determining impurities, the base zone being formed by diffusion of impurities into a limited portion of an epitaxial layer, and the emitter zone being formed by diffusion with a limited portion of the base zone. In the bipolar transistor device thus fabricated, the resulting spreading resistance of the base zone imposes a lower limit upon the response time or switching time, typically of about 10 nanoseconds or more, which can be undesirably high for high speed applications where the desired frequency response can be as high as 10 GHz, corresponding to a response time of one-tenth nanosecond.

Another form of bipolar transistor is of the lateral structure; that is, the overall flow of minority charge carriers in the base region is parallel to the major surface of the semiconductor at which the emitter and collector are located. See, for example: P. R. Gray and R. G. Meyer, Analysis and Design of Analog Integrated Circuits, p. 91 (1977). Because of the way in which it is conventionally fabricated, such a transistor structure is ordinarily characterized by a base zone or region which is more lightly doped with impurities than is the collector. Consequently, in such a transistor structure, precautions must be taken to prevent the depletion region at the collector-base junction during operation from reaching the emitter; namely, widening the base region, and hence, undesirably increasing the switching time.

In an application filed concurrently herewith by the same inventors Ser. No. 141120, entitled "Short Channel Field Effect Transistors," a method is disclosed for fabricating FET's (field effect transistors) with metal silicide contacts, characterized by well-controlled, short channels, and hence high speed of response.

SUMMARY OF THE INVENTION

The method described in the aforementioned patent application can be modified in such a way as to provide a lateral bipolar transistor in which the doping of the base region need not be as lightly doped as in the prior art; consequently, the speed of response is enhanced. Specifically, a base region of relatively high impurity doping concentration is formed by the diffusion of impurities from a polycrystalline silicon electrode serving as the base contact in a structure otherwise fabricated similarly as the MESFET (metal gate FET) in the aforementioned patent application.

In a specific embodiment of the present invention (FIG. 4), a lateral bipolar transistor device structure in a semiconductive single crystal silicon layer (10) of essentially moderate, first type conductivity having a pair of spaced apart localized zones (10.1, 10.2) of second, opposite conductivity type forming, respectively, an emitter and a collector zone of said transistor at a major surface thereof is CHARACTERIZED BY a polycrystalline silicon electrode layer (13) of said first type conductivity located contiguous with a portion of the major surface of said single crystal silicon layer (10) in the space between said localized zones (10.1, 10.2), said polycrystalline electrode layer (13) serving as the base electrode contact of said transistor device, and a base zone (13.6) of said first type conductivity higher than said moderate conductivity extending in said silicon layer (10) from one of said localized zones (10.1, 10.2) to the other, said base zone (13.6) formed by diffusion of impurities from said polycrystalline layer (13) into a portion of single crystal layer (10) underlying said polycrystalline layer (13). Reach-through of the depletion region at the collector-base to the emitter is suppressed by a buried P-type zone (11.2) of higher conductivity than said moderate conductivity located underneath the collector zone (10.2), and can be further suppressed by a similarly buried P-type zone (11.1) located underneath the emitter zone (10.1).

BRIEF DESCRIPTION OF THE DRAWING

This invention together with its features, objects, and advantages can be better understood from the following detailed description when read in conjunction with the drawings in which.

Figure 1:
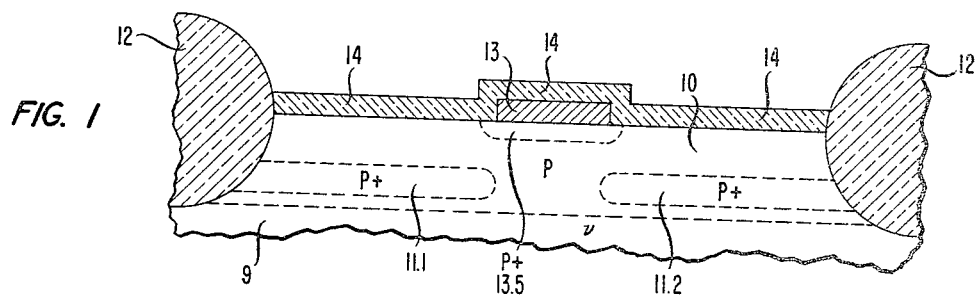
FIGS. 1–4 show in cross-section a sequence of various stages of the fabrication of a lateral bipolar transistor device, in accordance with a specific embodiment of the invention.
Figure 2:
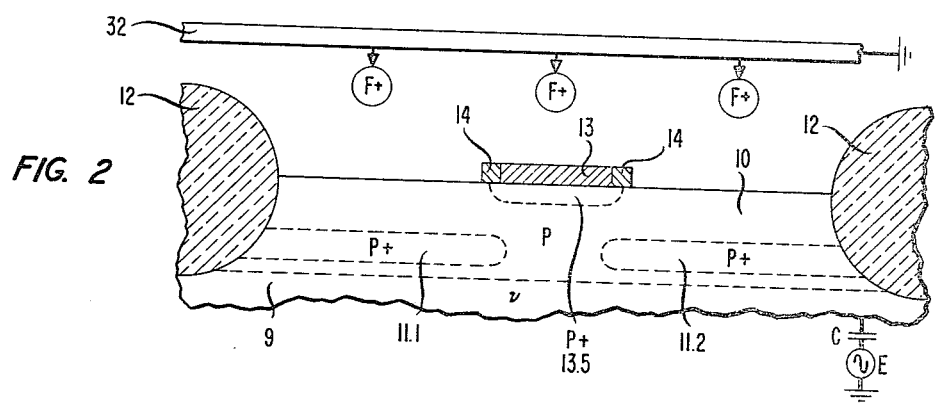

Only for the sake of clarity, none of the drawings is to any scale.

DETAILED DESCRIPTION

As shown in the sequence of drawings, FIGS. 1–4, lateral bipolar transistor device 20 can be fabricated on a top major surface of a monocrystalline semiconductive silicon body. As known in the art of semiconductor multiple device fabrication ("batch techniques"), many similar such transistor devices can be simultaneously fabricated in such a body, all of these devices being mutually electrically isolated by relatively thick field oxide regions 12.

The silicon body is formed by a single crystal semiconductor bulk portion 9 upon a major planar surface of which has been grown an epitaxial semiconductor layer 10. Typically, the semiconductor 9 is ν-type conductivity single crystal, silicon; that is, having a relatively low N-type conductivity, for example, a bulk conductivity of about 10 ohm cm. The epitaxial (single crystal) layer 10 is advantageously of moderate electrical conductivity of one type, typically P-type, owing to a moderate not significant acceptor impurity concentration, typically in the range of about $10^{16}$ to $10^{17}$ per $cm^3$. The thickness of this epitaxial layer is typically about 2 micron.

In order to fabricate the device 20 (FIG. 4) upon a pre-selected area of the exposed top major surface of the epitaxial layer 10, an electrically conductive polycrystalline silicon ("polysilicon") layer 13 (FIG. 1) of P+ (strongly P-type) conductivity type is formed on a limited portion of the exposed top surface of the epitaxial layer 10, typically by conventional masking and etching techniques applied to a polycrystalline silicon layer originally deposited over the entire top surface of the epitaxial layer. In order that the electrical conductivity be sufficiently high in the polysilicon layer 13 for use as an electrode, this layer is heavily doped with acceptor impurities such as boron, typically to a doping level of about $10^{18}$ per cm$^3$ or more. Also, this polysilicon layer 13 has a length of typically about one micron or less measured in the direction of the emitter to collector (horizontal direction in FIGS. 1-4), and this layer 13 has a width of typically a few microns or more in the transverse direction (perpendicular to the plane of the drawing). This doped polysilicon layer 13 is thus useful as a base electrode contact to the semiconductor in the completed device 20 (FIG. 4). By reason of outdiffusion of acceptor impurities from the polysilicon layer 13 into the silicon layer 10, a strongly P-type base zone 13.5 is formed, with a concentration of about $10^{18}$ acceptor impurities or more per cubic centimeter.

Either before or after the formation of this polycrystalline layer 13, relatively thick "isolation" oxide regions 12 are embedded by a conventional thermal oxidation process at selected portions of the epitaxial layer 10 down to the underlying $\nu$-type crystal 9, in order to provide conventional oxide isolation between neighboring devices. Then, buried P+ regions 11.1 and 11.2 are formed, typically by implantation with 300 kev boron ions to a depth of about 0.7 micron with a half-width of about 900 angstrom, using the polysilicon layer as a mask. The peak concentration of significant boron impurities is typically about $10^{19}$ per cm$^3$ in these buried regions 11.1 and 11.2. These buried regions serve as precautions against "reach-through" (or "punch-through") of the electric field from the collector-base junction to the emitter-base junction, which would produce an undesired low resistance emitter to collector path.

Next, the exposed top and side surfaces of the polysilicon layer 13, as well as the exposed top surface of the epitaxial layer 10, are subjected to a thermal oxidation process; thereby, a relatively thin silicon dioxide coating layer 14 is formed on the exposed surfaces of both the polysilicon layer and the epitaxial layer. This oxide layer 14 has a thickness of in the range of about typically about 500 angstrom to 1000 angstrom; and may have a somewhat different thickness on the epitaxial layer from that which it has on the polysilicon layer.

Then the oxide layer 14 is removed, except for the portion thereof coating the side surfaces of the polysilicon layer 13. This removal of the oxide advantageously can be achieved by an anisotropic etching technique such as chemically reactive backsputtering (FIG. 2) with fluoride ions (F+) in a plasma produced by carbon tetrachloride, while the temperature of the body 10 is maintained at an elevated temperature typically of about 500 degrees C. By "anisotropic" etching is meant etching preferentially in the direction perpendicular to major surface of the epitaxial layer 10. For example, a cathode plate 32, typically of platinum, is located at a distance of typically several inches from the epitaxial layer 10 in an evacuated chamber (not shown). This body is mounted on an electrically conducting plane (not shown) connected through a capacitor C to an RF voltage source E, typically about 500 volts peak to peak at a frequency in the range of about 200 KHz to 14 MHz, typically 13.5 MHz. The pressure in the chamber is reduced to below about 1 mm Hg, typically about 50 micron Hg, in order that while a plasma forms in the neighborhood of the cathode plate 32, the top surface of the epitaxial layer 10 remains inside a dark space region of the discharge from the cathode plate 32. The RF power is typically in the range of about 20 to 100 watts for a cathode of several inches diameter. In this manner, the fluoride ions bombarding any element (including the oxide and polysilicon layer) located at the top surface of the epitaxial layer 10 strike it from a direction which is essentially normal to its top major surface; thereby these ions remove the thin oxide only at the surface portions where the normal to the surface is parallel to the velocity vector of the bombarding ion, but not at the side portions. In so removing the thin oxide portions, however, it is important that the side surfaces of the polysilicon layer 13 thus remain coated with the thus remaining portions of the oxide layer 14. The thickness (in the horizontal direction) of this remaining sidewall oxide is typically about 0.1 to 0.3 micron, and is in any event advantageously equal to, or less than, approximately the Debye length in the silicon in the base region of the ultimately completed device.

Figure 3:
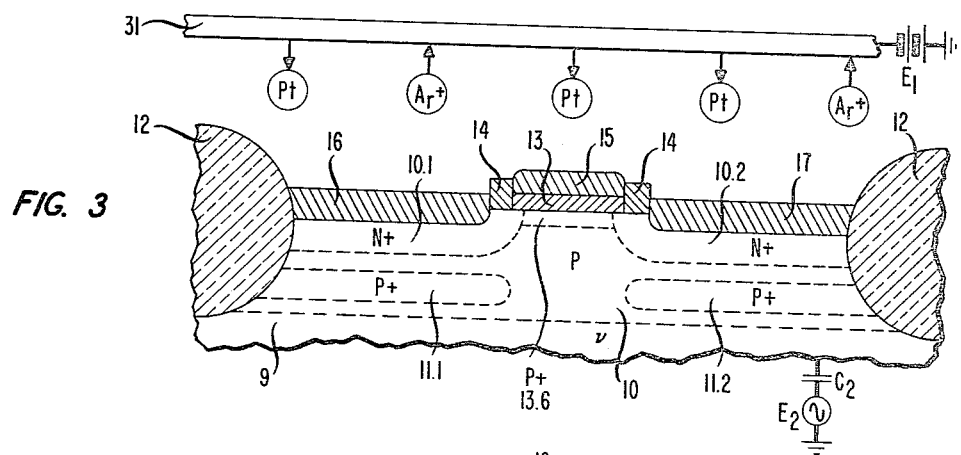
Figure 4:
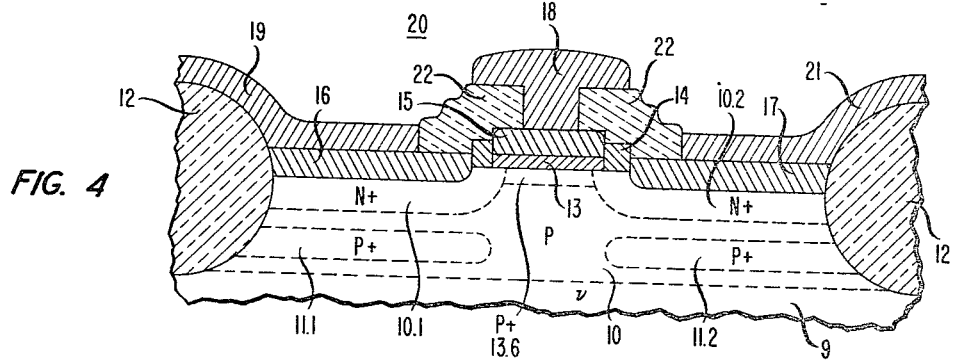

Next, as indicated in FIG. 3, positively charged argon ions are directed upon a platinum target 31 in order to sputter platinum from the target onto the epitaxial layer 10. These positive argon ions have suitable kinetic energies due to an accelerating voltage $E_1$ (of negative polarity) applied to the target. This sputtering of platinum results in the arrival of platinum atoms and/or platinum ions at the exposed top surface of the epitaxial layer 10, to form the platinum silicide electrode layers 15, 16, and 17. The voltages $E_1$ and $E_2$ are adjusted so that the removal rate of platinum from the exposed oxide portions of the top surface is greater than, the arrival rate. Thus, substantially no metal or metal-like substance of any kind (platinum or platinum silicide) accumulates on any portion of exposed oxide 12 or 14. As a precaution against the remaining of any such metal on exposed oxide, etching in hot aqua regia solution, for example, can be used to remove the unwanted metallic platinum.

The donor impurity dopant arsenic or antimony (or both) is advantageously added to the target 31 for the purpose of simultaneously forming a pair of spaced apart localized, self-aligned N+ zones 10.1 and 10.2 at the top surface of the epitaxial layer 10 during the bombardment with platinum, the polycrystalline layer 13 acting as a mask to self-align these N+ zones. These N+ zones are formed by rejection from the platinum silicide of the dopant into the silicon ("segregation coefficient"). Because all subsequent processing temperatures are well below the temperature at which significant diffusions of impurities in silicon occurs, the depth of the resulting N+ P junctions in the silicon (beyond the platinum silicide) can be as little as 100 angstrom or less.

Alternatively, these N+ zones can be formed at an earlier stage of fabrication, for example, by means of conventional techniques as ion implantation and diffusion of donor impurities using the polycrystalline layer 13 with sidewall oxide 14 as a mask to self-align the N+ zones therewith. These N+ zones 10.1 and 10.2 serve as the emitter and collector zones, respectively, of the final transistor device structure 20 (FIG. 4), while the intervening P+ zone 13.6 serves as the base zone thereof. Typically, these N+ zones penetrate beneath the top surface of the epitaxial layer 10 to a depth of about 1000 to 2000 angstrom, with a net impurity concentration of the order of at least $10^{21}$ per cubic centimeter. To avoid the problem of reverse bias breakdown at the collector-base junction, the impurity doping levels should be arranged such that the collector zone 10.2 is doped greater than about $10^{21}$ per cubic centimeter but the doping level in the base zone 13.6 should be limited to approximately $2 \times 10^{19}$ per cubic centimeter or less;

thereby as much as a 5 volt collector-base breakdown voltage is obtainable.

Typical values of the parameters useful for this platinum bombardment step are: $E_1$ and $E_2$ equal to about 1000 volts, $E_1$ being D.C. and $E_2$ having a frequency of about 13 MHz. The frequency and amplitude of $E_2$ control the removal rate of platinum and platinum silicide during the bombardment. The fact that the removal rate of platinum is thus made to be about two or more times that of platinum silicide tends to ensure the net removal of any metallic platinum initially arriving on the exposed oxide while the net permanent formation and accumulation of platinum silicide occurs on the exposed silicon (whether monocrystalline or polycrystalline). The temperature of the body 9 during this sputtering process is typically about 625 degrees C., while the ambient pressure of argon is typically about 10 to 20 micron Hg.

After the formation of the platinum silicide layers 15, 16, and 17 on the exposed silicon surfaces to a thickness of typically about a few hundred angstroms, the top surface of the epitaxial layer 10 is coated with an insulating layer 22 (FIG. 4) at selected areas by means of conventional deposition, masking, and etching techniques. This layer 22 is typically essentially tetra-ethyl-orthosilicate having a thickness of, for example, about 5000 angstrom. By conventional techniques, metallization such as aluminum is then applied through apertures in layer 22 to contact the platinum silicide layers 15, 16, and 17, in order to form the respective electrode metallization contacts 18, 19, and 21 for the base, emitter, and collector, respectively, of the completed lateral bipolar transistor device 20.

The length (emitter to collector) of the polysilicon layer 13 in the completed device 20 can be as low as about ¾ micron, while the distance of closest mutual approach of the N+ zones 10.1 and 10.2 can be as little as about 0.5 micron. Thus, the resulting lateral bipolar NPN transistor structure (10.1, 13.6, 10.2) can be characterized by a transit time of charge carriers across the base zone of as low as 100 picoseconds; thus switching times of this order can be achieved, and the transistor 20 can operate in the ten gigahertz frequency range. Moreover, a relatively low collector storage time, of the order of picoseconds, expected in the structure of this invention enables fabrication of saturating circuits (voltage overdrive sufficient to forward bias the collector-base junction) without the need for storage time clamps (like Schottky diodes) to limit the storage time.

Although the invention has been described in detail with reference to a specific embodiment, various modifications can be made without departing from the scope of the invention. For example, one or both of the buried regions (11.1, 11.2) can be omitted, the presence of the buried region (11.2) underneath the collector zone (10.2) probably being the more important for suppressing reach-through during operation. Also, as understood in the art, N and P type conductivities may be everywhere interchanged. Finally, instead of using the P-type epitaxial layer 10 for building the transistor 20 therein, the transistor can be built in a P-region contiguous with the surface of a semiconductive silicon body which has been initially prepared with suitable impurity dopings to provide suitable electrical conductivities at the respective interfaces of this P-region with the field oxide ("channel stopper") and with the polysilicon layer 13 ("gate doping").

We claim:

1. Semiconductor apparatus comprising a lateral bipolar transistor device structure in a semiconductive, single crystal silicon layer (10) of essentially moderate, first type conductivity having a pair of spaced apart localized zones (10.1, 10.2) of second, opposite conductivity type forming, respectively, an emitter and a collector zone of said transistor at a major surface thereof is CHARACTERIZED BY a polycrystalline silicon electrode layer (13) of said first type conductivity located contiguous with a portion of the major surface of said single crystal silicon layer (10) in the space between said localized zones (10.1, 10.2), said polycrystalline electrode layer (13) serving as the base electrode contact of said transistor device, and a base zone (13.5) of said first type conductivity higher than said moderate conductivity extending in said silicon layer (10) from one of said localized zones (10.1, 10.2) to the other, said base zone (13.6) formed by diffusion of impurities from said polycrystalline layer (13) into a portion of single crystal layer (10) underlying said polycrystalline layer (13).

2. Apparatus according to claim 1 FURTHER CHARACTERIZED BY a buried zone (11.2) in said single crystal layer (10), said buried zone (11.2) being of said first type conductivity higher than said moderate conductivity and located underneath said collector zone on the opposite side thereof from said major surface.

3. Apparatus according to claims 1 or 2 in which said first conductivity type is P-type and said opposite type is N-type.

4. Apparatus according to claim 1 or 2 which further comprises a pair of spaced apart metal-silicide electrodes (16, 17) making contact with each corresponding one of said localized zones (10.1, 10.2).

5. Apparatus according to claim 4 which further comprises a metal-silicide type (15) making contact with said polycrystalline layer (13).

6. Semiconductor apparatus including a transistor device comprising:
   (a) a single crystal semiconductive silicon layer of essentially relatively moderate one conductivity type;
   (b) first and second spaced apart metal-silicide electrodes located contiguous with first and second portions, respectively, of a major surface of said layer;
   (c) a polycrystalline silicon electrode layer of said one conductivity type located contiguous with a third portion of said major surface located in the space between said first and second portions;
   (d) first and second localized zones each of conductivity type opposite said one conductivity type located in said single crystal layer contiguous with said first and second portions, respectively, of said major surface; and
   (e) a third localized zone of said one conductivity type and of higher conductivity than said moderate conductivity located in said single crystal layer contiguous with the third portion of said major surface.

7. Apparatus according to claim 6 in which said third localized zone is formed by diffusion of impurities determining said one conductivity type from said polycrystalline layer.

8. Apparatus according to claim 6 or 7 in which said one conductivity type is P-type and said opposite conductivity type is N-type.

9. Apparatus according to claim 8 in which said first and second zones are spaced apart by about 0.5 micron or less.

* * * * *

UNITED STATES PATENT AND TRADEMARK OFFICE
CERTIFICATE OF CORRECTION

PATENT NO. : 4,259,680
DATED : March 31, 1981
INVENTOR(S) : Martin P. Lepselter and Simon M. Sze It is certified that error appears in the above-identified patent and that said Letters Patent is hereby corrected as shown below:

In the claims, column 6, line 12, "(13.5) should read --(13.6)--.

Signed and Sealed this

Twenty-fourth Day of October, 1989

Attest:

DONALD J. QUIGG

Attesting Officer

Commissioner of Patents and Trademarks